United States Patent
Radu et al.

(10) Patent No.: US 6,956,285 B2
(45) Date of Patent: Oct. 18, 2005

(54) EMI GROUNDING PINS FOR CPU/ASIC CHIPS

(75) Inventors: Sergiu Radu, Fremont, CA (US); Bidyut K. Sen, Milpitas, CA (US); David Hockanson, Boulder Creek, CA (US); John E. Will, Pleasanton, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/345,015

(22) Filed: Jan. 15, 2003

(65) Prior Publication Data

US 2004/0135238 A1 Jul. 15, 2004

(51) Int. Cl.[7] .................. H01L 23/48; H01L 23/12; H01L 23/06; H01L 23/52
(52) U.S. Cl. .............. 257/697; 257/660; 257/704; 257/707; 257/713; 257/778; 257/659
(58) Field of Search ........................ 257/704, 707, 257/713, 660, 778, 697, 774

(56) References Cited

U.S. PATENT DOCUMENTS

| | | | |
|---|---|---|---|
| 4,082,394 A | * 4/1978 | Gedney et al. ........... 439/69 |
| 5,166,772 A | 11/1992 | Soldner et al. |
| 5,357,404 A | 10/1994 | Bright et al. |
| 5,490,040 A | * 2/1996 | Gaudenzi et al. ......... 361/773 |
| 5,561,265 A | 10/1996 | Livshits et al. |
| 5,566,052 A | 10/1996 | Hughes |
| 5,639,989 A | 6/1997 | Higgins, III |
| 5,703,397 A | * 12/1997 | Endo et al. .............. 257/701 |
| 5,745,344 A | * 4/1998 | Baska et al. ............. 361/705 |
| 5,748,455 A | 5/1998 | Phillips et al. |
| 5,753,857 A | 5/1998 | Choi |
| 5,804,872 A | * 9/1998 | Miyano et al. ............ 257/668 |
| 5,825,634 A | 10/1998 | Moorehead, Jr. |
| 6,008,536 A | * 12/1999 | Mertol .................... 257/704 |
| 6,057,600 A | 5/2000 | Kitazawa et al. |
| 6,063,999 A | 5/2000 | Kelly |
| 6,088,231 A | 7/2000 | Fajardo |
| 6,137,051 A | 10/2000 | Bundza |
| 6,140,577 A | 10/2000 | Rapaich et al. |
| 6,198,630 B1 | 3/2001 | Cromwell |
| 6,239,359 B1 | 5/2001 | Lilienthal, II et al. |
| 6,252,313 B1 | 6/2001 | Zhang et al. |
| 6,259,609 B1 | 7/2001 | Kurz |
| 6,269,863 B1 | 8/2001 | Wyler |
| 6,278,617 B1 | 8/2001 | Yang et al. |
| 6,288,330 B1 | 9/2001 | Chen |
| 6,294,731 B1 | * 9/2001 | Lu et al. .................. 174/35 R |
| 6,324,074 B1 | 11/2001 | Lunden |
| 6,362,477 B1 | 3/2002 | Sowerby et al. |
| 6,400,164 B1 | 6/2002 | Sampath |
| 6,455,925 B1 | * 9/2002 | Laureanti ................. 257/678 |
| 6,483,406 B1 | 11/2002 | Sawa et al. |
| 6,515,870 B1 | * 2/2003 | Skinner et al. ............ 361/800 |
| 6,518,660 B2 | * 2/2003 | Kwon et al. .............. 257/704 |
| 6,573,590 B1 | 6/2003 | Radu et al. |
| 6,597,575 B1 | 7/2003 | Matayabas et al. |
| 6,683,796 B2 | 1/2004 | Radu et al. |
| 6,703,704 B1 | 3/2004 | Alcoe et al. |
| 2004/0012939 A1 | 1/2004 | Ta et al. |

* cited by examiner

Primary Examiner—Nitin Parekh
(74) Attorney, Agent, or Firm—Meyertons Hood Kivlin Kowert & Goetzel, P.C.; B. Noël Kivlin; Chris D. Thompson (57) ABSTRACT

An integrated circuit package includes EMI containment features. The EMI containment features may include a plurality of pins on a substrate of the integrated circuit package. The pins may be a peripheral row of pins in an array of pins. The pins may couple a lid of the package to at least one ground plane of a circuit board.

38 Claims, 7 Drawing Sheets

EMI GROUNDING PINS FOR CPU/ASIC CHIPS

BACKGROUND OF THE INVENTION

1. Field of the Invention

The present invention relates generally to integrated circuit (IC) packages, and more specifically to containing electromagnetic interference (EMI) generated by integrated circuits.

2. Background Information

Many electronic devices such as integrated circuits generate undesirable amounts of EMI. Typically, the "noise" generated by the integrated circuit originates from the die and its connections to the pins through the package, and is coupled to the heatspreader or lid covering the die and then to the heatsink, which acts as an antenna that further radiates the EMI. As the EMI is coupled to neighboring components and integrated circuits, it interferes with their individual performance which may, in turn, affect the overall performance of a system. Because of the negative effects of EMI and because the level of acceptable radiated EMI is subject to strict regulatory limits, it is desirable to contain or suppress the EMI generated by an integrated circuit.

Some solutions involve grounding the heatsink and building a Faraday cage around the EMI producing chip (e.g., a CPU). This solution typically involves the use of a grounded gasket that surrounds the chip and makes contact with the heatsink. The effectiveness of this solution is dependent on having good contact between the gasket and the heatsink and between the heatsink and the chip lid. In addition, because of the gasket contacts with ground on the top layer of the PCB, the routing of the pin escapes on the top layer may be very difficult or even impossible. In such a situation, the PCB may need additional layers which increases the cost of the PCB. Furthermore, the gasket itself represents an additional cost and potential point of failure, as it is a separate part that must be added to the PCB. Gaskets may take up space on the printed circuit board in the area surrounding the chip that might otherwise be used for electronic components.

It would be beneficial to have an EMI containment system that does not require elements external to the chip package and which allows for routing of pin escapes on the top layer of a PCB.

SUMMARY OF THE INVENTION

In an embodiment, an integrated circuit package may include EMI containment features. The EMI containment features may include a plurality of pins on a substrate of the integrated circuit package. The pins may be located around the periphery of the substrate. In an embodiment, the pins may be a peripheral row of pins in an array of pins. The pins may couple a lid of the package to at least one ground plane of a circuit board to which the package is coupled. A socket on the circuit board may be adapted to receive the peripheral pins and the regular pins of the integrated circuit package.

In an embodiment, a plurality of vias may be included in a substrate of a package to couple peripheral pins to a lid of the package. The peripheral pins may be coupled to an internal ground plane of a package.

In an embodiment, at least one side surface of the package may be metalized. The metalization may extend over a top surface of a substrate of the package and couple with a ground plane of the package. In another embodiment, a lid of a package may include sides that extend downward from body of the lid at least a portion of the distance between the body and a printed circuit board.

A heat sink may be coupled to a lid of a package. In an embodiment, the heatsink may be electrically isolated from the lid to inhibit coupling between the heatsink and elements of the integrated circuit package. In another embodiment, the heatsink may be electrically coupled to the lid. In still another embodiment, the heatsink may be integral to the lid.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 1:
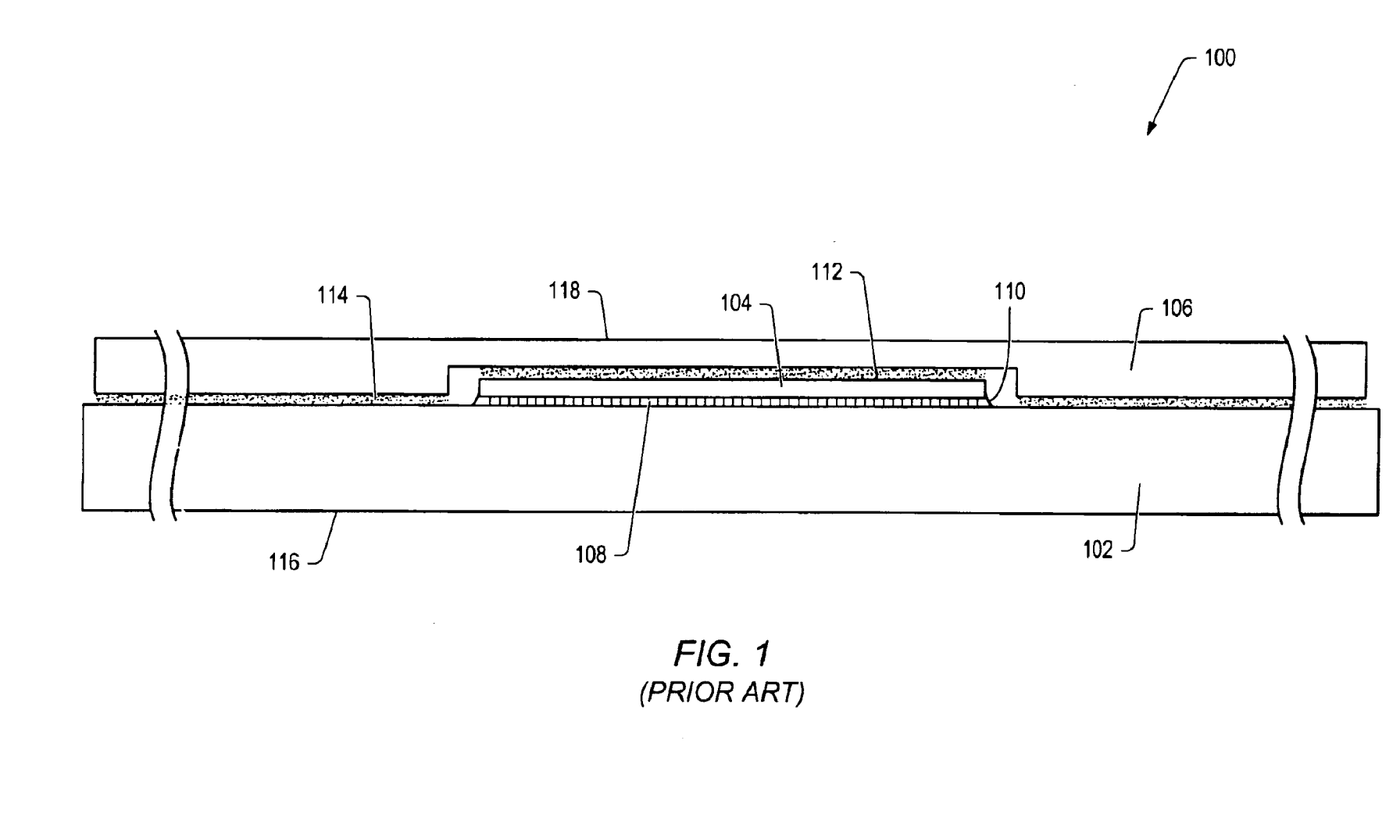
FIG. 1 depicts a side view of a typical integrated circuit package.

FIG. 1 depicts a side view of a typical integrated circuit (IC) package 100. An integrated circuit, as used herein, may include, but is not limited to, a processor such as a central processing unit(s), or an application specific integrated circuit (ASIC). A die 104 is coupled to the top surface of a substrate 102 using conductive bumps 108. Die underfill 110 may fill the gap between die 104 and substrate 102. A lid 106 is placed over die 104 and is coupled to die 104 using adhesive 112. Lid 106 is also coupled to substrate 102 using adhesive 114. Surface 116 of substrate 102 may be a socket contact surface. Surface 118 of lid 106 is the heatsink contact surface.

A typical integrated circuit package, such as IC package 100, may not include any EMI containment features. The noise originating from die 104 may be coupled to lid 106 and continue on to a heatsink (not shown) in contact with lid 106. Once the noise reaches the heatsink, it may need to be suppressed at the PCB level using a gasket, for example. Otherwise, the noise may couple from the heatsink to neighboring components, with the heatsink acting as an antenna.

Figure 2A:
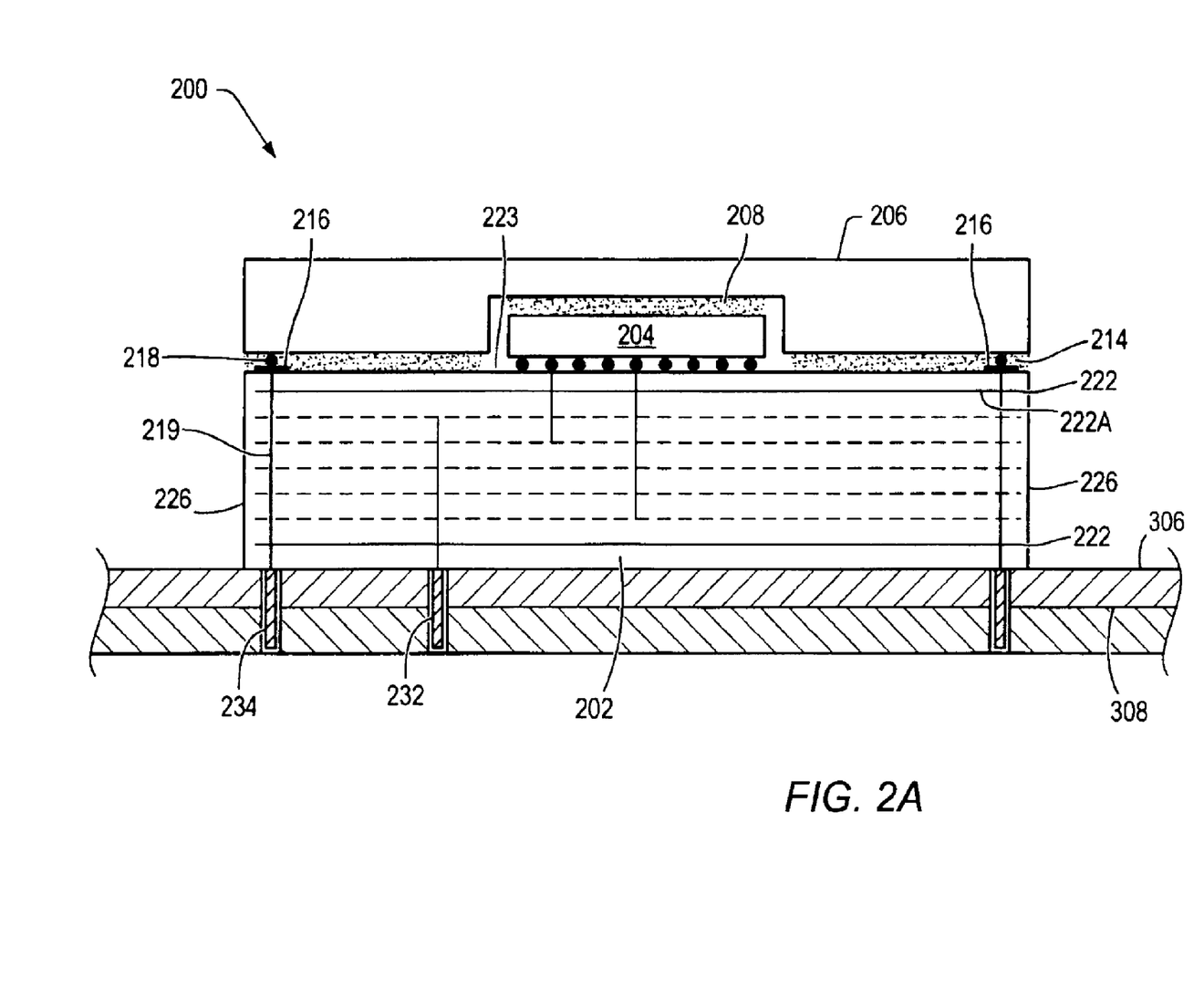
FIG. 2A depicts a cross sectional side view of an integrated circuit package in accordance with the teachings of the present invention.
Figure 2B:
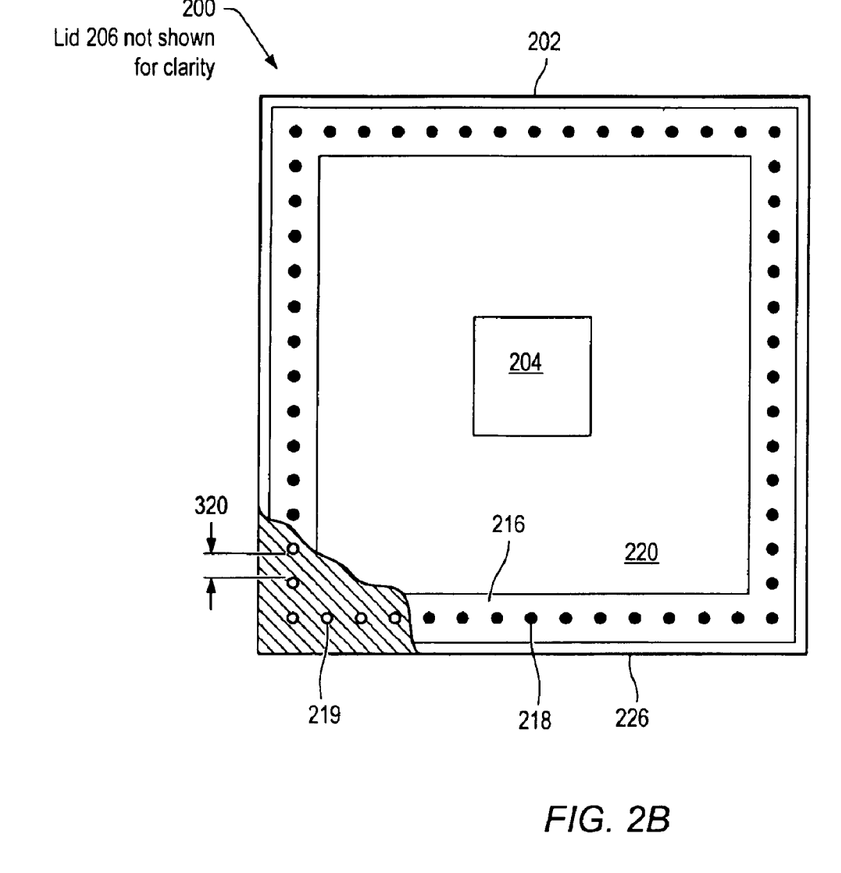
FIG. 2B depicts a cutaway top view of the integrated circuit package of FIG. 2A, with the lid removed for clarity.

FIGS. 2A and 2B depict an IC package 200 including a substrate 202 having EMI containment features. Referring to FIG. 2A, IC package 200 may include a die 204 coupled to substrate 202, and a lid 206 placed over die 204 and substrate 202. Die underfill (not shown) fills the gap between die 204 and substrate 202. Lid 206 may be coupled to die 204 using an adhesive 208. Substrate 202 may have a number of internal layers, such as power planes, ground planes and signal layers. Substrate 202 may include regular pins 232 to electrically couple elements of IC package 200 with other components of a system.

Vias 219 may be included in substrate 202 along a periphery of the substrate. Each via 219 may couple a top surface 220 of substrate 202 to a peripheral pin 234 on substrate 202. Vias 219 may be electrically isolated from signal and power conductors in IC package 200. Solder bumps 218 may be provided for each via 219 where the via intersects top surface 220. In one embodiment, vias 219 may be plated through holes. However, it will be understood that vias 219 may include any element that is adapted to electrically couple peripheral pins 234 to a conductive element at top surface 220.

Each peripheral pin 234 may be coupled with a ground plane 308 of printed circuit board 306. In an embodiment, ground plane 308 may be the solid ground plane of the printed circuit board that is nearest to IC package 200. "Pin," as used herein, includes, but is not limited to, any component that is adapted to provide an electrical path to a circuit board, such as a straight pin, pad, or solder ball. Thus, the regular pins 232 and peripheral pins 234 of IC package 200 may be any of a various types known to those skilled in the art, including, but not limited to, Pin Grid Array (PGA), micro Pin Grid Array (μPGA), Ball Grid Array (BGA), or Land Grid Array (LGA). In an embodiment, printed circuit board 306 may include a socket configured to receive regular pins 232 and peripheral pins 234. The socket may be of an industry standard type, such as are known to those skilled in the art.

Referring to FIG. 2B, a conductive trace 216 may be disposed on top surface 220 of substrate 202 near a periphery of IC package 200. Conductive trace 216 may be formed as part of the etching process used to prepare substrate 202. Conductive trace 216 may couple with vias 219.

Referring again to FIG. 2A, lid 206 may be coupled to substrate 202 using an adhesive 214. Adhesive 214 may be a conductive adhesive so as to form a conductive path between lid 206 and vias 219. Alternatively, solder bumps 218 at may be used to solder lid 206 to conductive trace 216. In an embodiment, soldering of solder bumps 218 may be accomplished using infrared soldering methods.

Figure 3A:
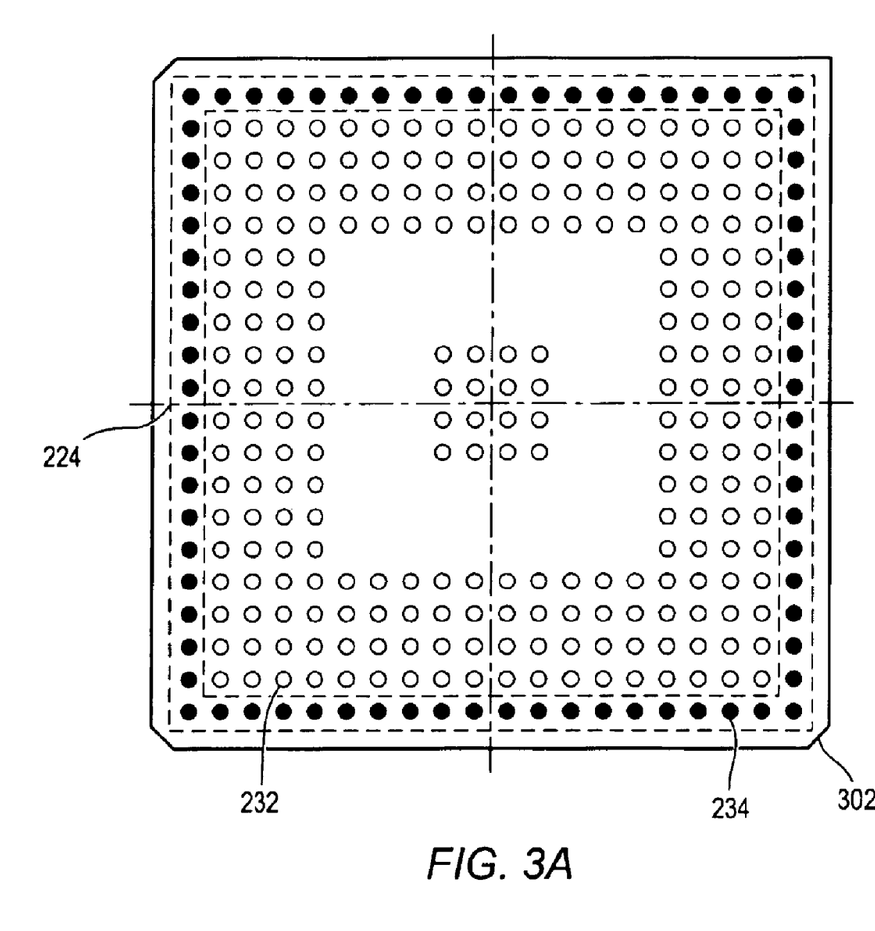
FIGS. 3A and 3B depict bottom views of integrated circuit packages, each having an alternative pin arrangement.
Figure 3B:
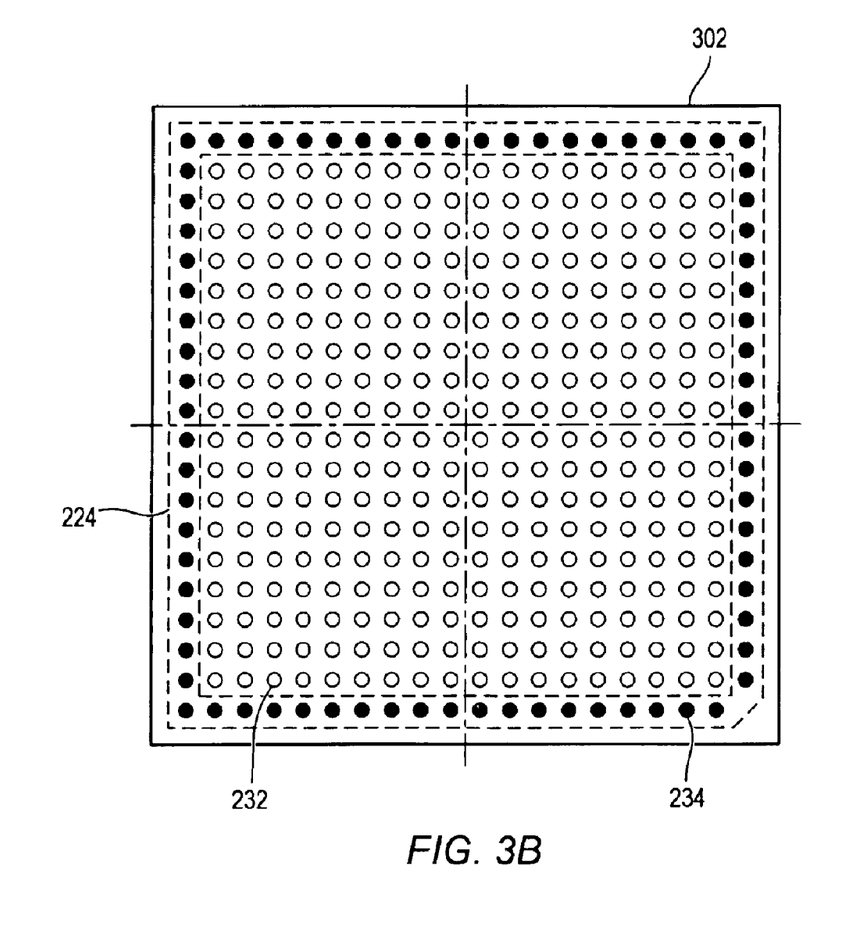

FIG. 3A depicts an array of pins on a bottom surface of a substrate 202. Row 224 of peripheral pins 234 may surround regular pins 232. The peripheral row may continue around the perimeter of the package. FIG. 3B depicts an alternate arrangement of regular pins 232 and peripheral pins 234. In some embodiments, a via 219 may be coupled to each pin in a peripheral row of pins. In other embodiments, vias 219 may correspond to only every other pin in a row, or every few pins in a row.

Printed circuit board 306 may include a conductive trace (not shown) on a top surface of printed circuit board 306. The conductive trace may be coupled to ground plane 308. In some embodiments, the conductive trace may form a continuous loop corresponding to the locations of row 224 of peripheral pins 234. In other embodiments, the conductive trace may run only along certain portions of peripheral pins, or may include breaks, such as to permit pin escapes on the top surface of the printed circuit board.

As depicted in FIG. 2B, vias 219 may be substantially regularly spaced along each side of substrate 202 to form gaps 320. The number of vias 219 and the size of gaps 320 may be selected to ensure an effective EMI shield. For example, if gaps 320 are too large, shielding effectiveness may be reduced. An appropriate gap size may depend on, among other things, an operating frequency of a circuit. Higher frequencies may require a more dense spacing of the vias. In an embodiment, gaps 320 may be less than about 5 millimeters. In another embodiment, gaps 320 may be between about 3 millimeters and about 5 millimeters. In some embodiments, each side of the substrate may include at least 4 vias.

Figure 4:
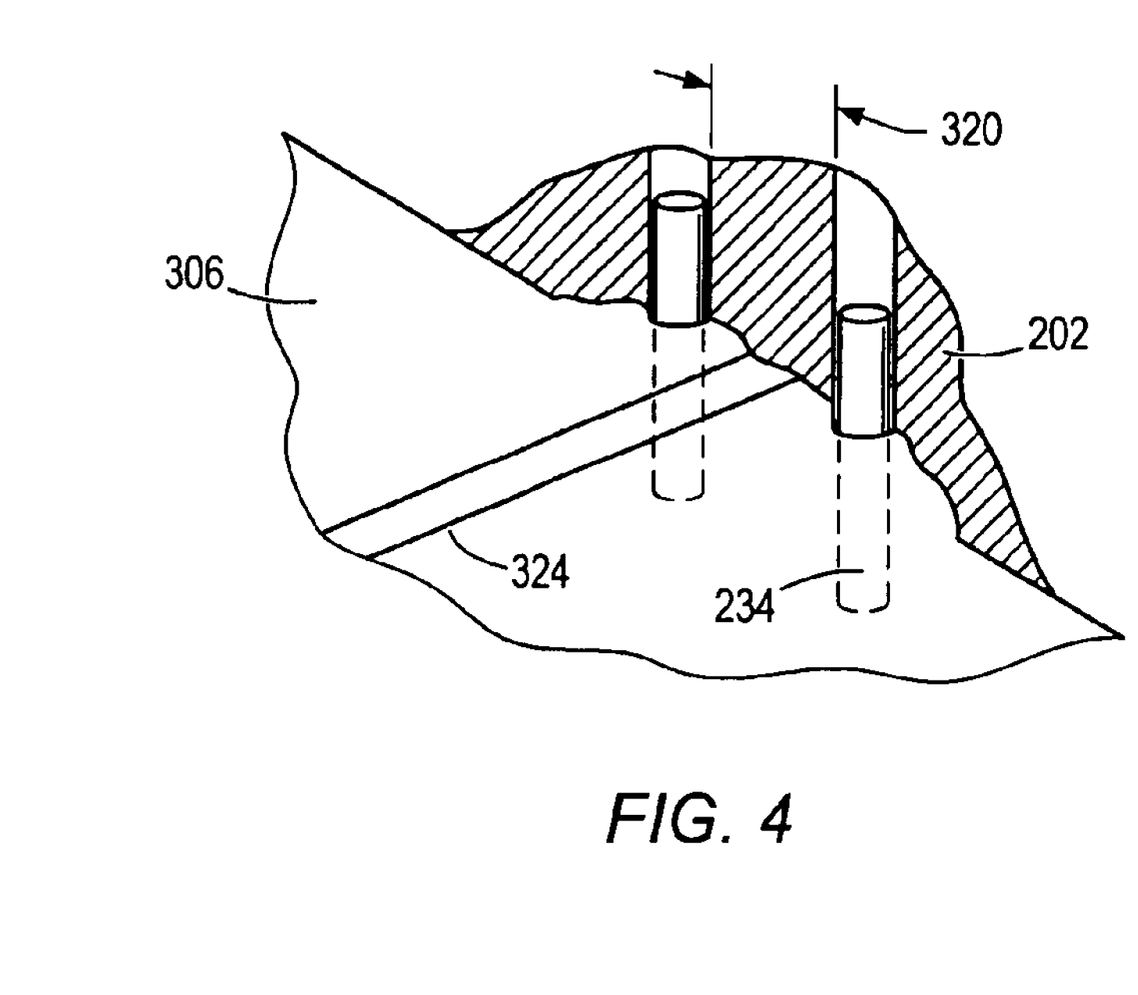
FIG. 4 depicts a detail view of a printed circuit board trace passing between two vias.

Referring to FIG. 4, gaps 320 between vias 219 may allow for pin escapes from regular pins 232 (not shown) of the IC package via traces 324 on the top surface of circuit board 306. For example, traces 324 may pass between two adjacent vias 219. Alternatively, traces 324 may pass through a row 224 at an unassigned peripheral pin 234 (i.e., one that is not coupled to a via 219). Allowing for pin escapes between vias 219 may allow for a more efficient layout of pin outs in an integrated circuit and may facilitate design of such layouts.

Figure 5:
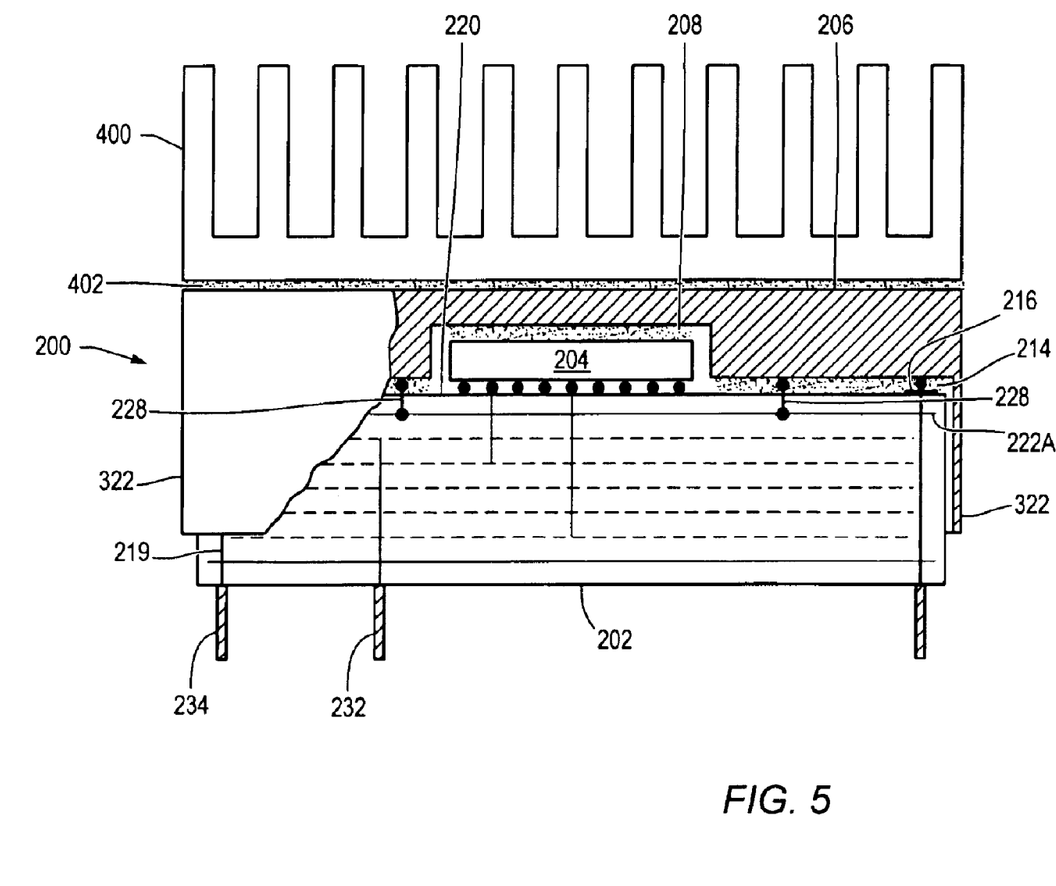
FIG. 5 depicts a cut away view of a lid that includes sides.

In certain embodiments, side surfaces 226 of substrate 202 may be metalized. The metalization may extend onto top surface 220 and couple with a ground plane on top surface 220 or with conductive trace 216. Metalization of side surfaces 226 may provide additional EMI shielding for IC package 200. In other embodiments, lid 206 may include sides on one or more edges of lid 206. As depicted in FIG. 5, sides 322 may extend downward from body of lid 206 at least a portion of the distance between the body and printed circuit board 306. Sides 322 may provide additional EMI shielding for IC package 200.

Coupling a lid to a ground plane conductor in a printed circuit board using vias in a package may provide a reliable, low impedance conductive path between the lid and the ground plane. The combination of lid 206, vias 219, and ground plane 308 of printed circuit board 306 may create a Faraday cage around the integrated circuit of IC package 200. The Faraday cage may contain EMI close to its source before it can be radiated or coupled away from the source.

Lid 206 and vias 219, each alone or in combination, may be effective in containing the spread of electromagnetic energy produced by IC package 200. In particular, vias 219 may be effective at containing electromagnetic energy generated near the periphery of IC package 200, while lid 206 may be effective at containing electromagnetic energy generated in the central areas of IC package 200. Containing electromagnetic energy generated by IC package 200 may prevent EMI from adversely affecting the operation of other components coupled to the printed circuit board 306, or even the operation of IC package 200 itself.

In some instances, the EMI features described herein may reduce EMI caused by coupling within the elements of substrate 202. During use, currents running through vias within substrate 202 may excite circular waves in the space between the internal layers of substrate 202, particularly between the power and ground planes. At the periphery of the internal structure of substrate 202, the circular waves may create a fringe field that is radiated to the outside of IC package 200. The open space between adjacent internal layers of substrate 202 may essentially act as a slot antenna that further radiates the noise. The Faraday cage including vias 219 may inhibit noise from spreading outside IC package 200.

In some embodiments, lid 206 may be electrically coupled to one or more ground planes that are internal to IC package 200. Referring again to FIG. 2B, IC package 200 may include one or more internal ground planes 222. Lid 206 may be electrically coupled to conductive trace 216. Conductive trace 216 may in turn be coupled to internal ground plane 222A by vias 219.

In another embodiment, a set of vias that is separate from vias 219 may couple lid 206 to an internal ground plane. As depicted in FIG. 5, vias 228 may couple internal ground plane 222A to lid 206. A conductive trace may be provided on the top surface 220 to tie vias 228 to each other. Vias 228 may be buried vias, as shown in FIG. 5. It will be appreciated that vias 228 may be through vias in another embodiment.

In one embodiment, internal ground plane 222A may be a ground plane for I/O functions. In another embodiment, internal ground plane 222A may be a ground plane for core functions. Internal ground plane 222A may be the solid ground plane of substrate 202 that is nearest to die 204. In certain embodiments, lid 206 may be coupled to a plurality of internal ground planes 222 in substrate 202.

In another embodiment, a plurality of pins may be included on a substrate of an integrated circuit package to electrically couple a ground plane of a circuit board to one or more internal ground planes of the substrate. For example, internal ground plane 222A may be coupled to ground plane 308 of printed circuit board 306. The pins may be electrically isolated from signal and power conductors in the package. The pins may be electrically coupled with a lid of the package.

Lid 206 may be coupled to die 204 using adhesive 208. In an embodiment, adhesive 208 may be a conductive epoxy. Using a conductive epoxy may promote the transfer of heat from die 204 to lid 206. On the other hand, if magnetic field effects are dominant, a nonconductive epoxy may be preferable for adhesive 208 to create a higher impedance path from die 204 to lid 206. A nonconductive epoxy may provide lower thermal performance than a conductive epoxy, but such performance may be acceptable for low power chips that produce small amounts of heat. In other embodiments, adhesive 208 may be omitted altogether.

Lid 206 may be made of one or more electrically conductive materials. These materials may include, but are not limited to, copper or aluminum. In addition, the materials for lid 206 may be selected based on thermal conductivity. Constructing lid 206 from a material that is both a good electrical conductor and a good heat conductor may improve its performance in shielding electromagnetic energy and conducting heat away from an electronic component. In certain embodiments, all or part of lid 206 may be made of a material that has a coefficient of thermal expansion similar to that of substrate 202. For example, for a ceramic substrate, lid 206 may be made of an alloy that includes iron and nickel, such as Kovar or Alloy 42.

In an embodiment, a heatsink may be coupled to IC package 200. FIG. 5 depicts a heatsink 400 coupled to IC package 200. Heatsink may be coupled to IC package 200 by a variety of methods known to those skilled in the art, including, but not limited to, an adhesive, a clamp, or screws. In one embodiment, heatsink 400 may be coupled to integrated circuit using epoxy 402 disposed between the mating surfaces of lid 206 and heatsink 400.

In some embodiments, an adhesive between heatsink 400 and IC package 200 may be electrically conductive. In other embodiments, adhesive may be substantially not electrically conductive. Using a non-conductive adhesive may inhibit electromagnetic coupling between the heatsink and other elements of the system.

In an embodiment, a heatsink may be an integral part of lid 206. Integrating a lid with a heatsink may eliminate a thermal interface between a lid and heatsink. Eliminating the thermal interface may enhance the thermal performance of the system.

EMI features described herein may reduce or even eliminate the need for separate, dedicated EMI components. For example, the features may obviate a need for separate EMI enclosures or gaskets. In addition, it may be unnecessary to include a heatsink as an element of an EMI containment system. Thus, in some embodiments, a heatsink may be coupled to IC package 200 using an electrically non-conductive adhesive. Electrically isolating the heatsink from the EMI containment system reduce coupling between the heatsink and elements of the IC package, and may improve effectiveness of the EMI containment system.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An integrated circuit package, comprising:
    a multilayered substrate having a plurality of electrically conductive horizontal layers;
    a die coupled to a top surface of the substrate;
    a plurality of pins on a bottom surface of the substrate, wherein the plurality of pins is disposed substantially along a periphery of the substrate; and
    a lid disposed over the die and the substrate,
    wherein the plurality of pins is electrically coupled to the lid substantially along the periphery of the substrate,
    wherein the side surfaces of the substrate are metallized, wherein the metallization is electrically coupled to the lid, wherein the metallization on the side surfaces is configured to provide EMI shielding for the package.

2. The integrated circuit package of claim 1, wherein the pins comprise a peripheral row in an array of pins.

3. The integrated circuit package of claim 1, wherein the plurality of pins comprise substantially every pin in a row of pins.

4. The integrated circuit package of claim 1, wherein the plurality of pins comprise not more than every other pin in a row of pins.

5. The integrated circuit package of claim 1, wherein the package is configured to couple to a socket on a circuit board.

6. The integrated circuit package of claim 1, wherein at least two of the pins are spaced from each other to allow a pin escape on a top layer of the circuit board.

7. The integrated circuit package of claim 1, further comprising a plurality of vias disposed in the substrate, wherein each of the vias is configured to couple one of the pins to the lid.

8. The integrated circuit package of claim 7, wherein at least two of the vias are spaced from each other, and wherein a gap between the at least two vias is less than about 5 millimeters.

9. The integrated circuit package of claim 7, wherein at least two of the vias are spaced from each other, and wherein a gap between the at least two vias is between about 3 millimeters and about 5 millimeters.

10. The integrated circuit package of claim 7, wherein the plurality of vias comprises at least 4 vias on each side of the package.

11. The integrated circuit package of claim 1, wherein the substrate further comprises an internal ground plane, wherein the lid is electrically coupled to the internal ground plane.

12. The integrated circuit package of claim 1, wherein the internal ground plane comprises an I/O around plane.

13. The integrated circuit package of claim 1, wherein the plurality of pins is electrically isolated from signal and power conductors in the package.

14. The integrated circuit package of claim 1, further comprising a solder on the top surface of the substrate, wherein the solder is configured to electrically couple the lid to the plurality of pins.

15. The integrated circuit package of claim 1, further comprising an electrically conductive adhesive on the top surface of the substrate, wherein the electrically conductive adhesive is configured to electrically couple the lid to the plurality of pins.

16. The integrated circuit package of claim 1, further comprising a substantially electrically insulating adhesive disposed between the die and the lid.

17. The integrated circuit package of claim 1, further comprising an electrically conductive adhesive disposed between the die and the lid.

18. The integrated circuit package of claim 1, wherein the lid comprises at least one side extending over at least a portion of a side surface of the substrate.

19. The integrated circuit package of claim 1, wherein the lid comprises an integral heatsink.

20. The integrated circuit package of claim 1, wherein the plurality of vias are disposed along a periphery of the package.

21. The integrated circuit package of claim 1, further comprising a heatsink electrically coupled to the lid.

22. The integrated circuit package of claim 1, further comprising a heatsink coupled to the lid, wherein the heatsink is electrically isolated from the lid.

23. A system for containing EMI in a semiconductor device coupled to a multilayered substrate having a plurality of electrically conductive horizontal layers in an integrated circuit package, the system comprising:
 a lid disposed over the semiconductor device;
 a plurality of pins on a bottom surface of the substrate, wherein the plurality of pins is electrically coupled to the lid substantially along a periphery of the substrate;
 wherein the side surfaces of the substrate are metallized, wherein the metallization is electrically coupled to the lid, wherein the metallization on the side surfaces is configured to provide EMI shielding for the package, and
 a circuit board, wherein the circuit board comprises a ground plane, and wherein the ground plane is electrically coupled to the plurality of pins.

24. The system of claim 23, wherein the plurality of pins are disposed around the periphery of the substrate.

25. The system of claim 23, wherein the pins comprise a peripheral row of an array of pins.

26. The system of claim 23, wherein the substrate is configured to couple to a socket on a circuit board.

27. The system of claim 23, further comprising a plurality of vias coupling the pins to the lid.

28. The system of claim 23, wherein the ground plane is a solid ground plane, wherein the solid ground plane is the ground plane of the circuit board that is nearest to semiconductor device.

29. The system of claim 23, wherein the wherein the substrate further comprises an internal ground plane, wherein the lid is electrically coupled to the internal ground plane.

30. The system of claim 23, wherein the lid comprises a heatsink.

31. A system for containing EMI in a integrated circuit package, comprising:
 an I/O ground plane disposed in a multilayered substrate having a plurality of electrically conductive horizontal layers;
 a board ground plane disposed in a circuit board;
 a plurality of pins on a surface of the substrate; and
 a lid coupled to the substrate;
 wherein the plurality of pins is electrically coupled to the lid substantially along a periphery of the substrate, wherein the plurality of pins are adapted to electrically couple the package ground plane to the board ground plane when the integrated circuit package is coupled to the circuit board;
 wherein the side surfaces of the substrate are metallized, wherein the metallization is electrically coupled to the lid, wherein the metallization on the side surfaces is configured to provide EMI shielding for the package.

32. The system of claim 31, wherein the plurality of pins is electrically isolated from signal and power conductors in the package.

33. An integrated circuit package, comprising:
 a multilayered substrate having a plurality of electrically conductive horizontal layers;
 a die coupled to a top surface of the substrate;
 a plurality of pins on a bottom surface of the substrate;
 a plurality of vias coupled the plurality of pins, and
 a lid disposed over the die and the substrate,
 wherein the plurality of vias extend to an upper surface of the substrate proximate to a lower edge of the lid;
 wherein the lid is electrically coupled to the plurality of vias, wherein the plurality of vias are electrically isolated from the signal and power conductors in the package;
 wherein the side surfaces of the substrate are metallized, wherein the metallization is electrically coupled to the lid, wherein the metallization on the side surfaces is configured to provide EMI shielding for the package.

34. The integrated circuit package of claim 33, wherein each of the vias is configured to couple one of the pins to the lid.

35. The integrated circuit package of claim 33, wherein the vias are disposed substantially along a periphery of the substrate.

36. The integrated circuit package of claim 33, wherein the vias are disposed substantially along a periphery of the substrate, wherein the vias are disposed in rows on each side of the substrate.

37. The system of claim 33, wherein the substrate further comprises an internal ground plane, wherein the lid is electrically coupled to the internal ground plane.

38. The integrated circuit package of claim 37, wherein the internal ground plane comprises a core ground plane.

* * * * *